US009385203B1

(12) United States Patent
Lue

(10) Patent No.: US 9,385,203 B1
(45) Date of Patent: Jul. 5, 2016

(54) ACTIVE DEVICE AND HIGH VOLTAGE-SEMICONDUCTOR DEVICE WITH THE SAME

(71) Applicant: MACRONIX INTERNATIONAL CO., LTD., Hsinchu (TW)

(72) Inventor: Hang-Ting Lue, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/587,022

(22) Filed: Dec. 31, 2014

(51) Int. Cl.
| | |
|---|---|
| H01L 29/06 | (2006.01) |
| H01L 29/08 | (2006.01) |
| H01L 29/40 | (2006.01) |
| H01L 29/78 | (2006.01) |
| H01L 29/423 | (2006.01) |
| H01L 29/417 | (2006.01) |
| H01L 27/088 | (2006.01) |

(52) U.S. Cl.
CPC ........ H01L 29/42376 (2013.01); H01L 27/088 (2013.01); H01L 29/41775 (2013.01); H01L 29/7835 (2013.01)

(58) Field of Classification Search
None
See application file for complete search history.

(56) References Cited

U.S. PATENT DOCUMENTS

| | | | |
|---|---|---|---|
| 8,138,570 B2 | 3/2012 | Williams et al. | |
| 2012/0061768 A1 | 3/2012 | Sasaki et al. | |
| 2013/0069144 A1* | 3/2013 | Mathew | H01L 29/7827 257/330 |
| 2013/0334601 A1* | 12/2013 | Dong | H01L 29/66704 257/339 |

OTHER PUBLICATIONS

TIPO Office Action dated Feb. 18, 2016 in corresponding Taiwan application (No. 104100023).

* cited by examiner

*Primary Examiner* — Khaja Ahmad
(74) *Attorney, Agent, or Firm* — McClure, Qualey & Rodack, LLP

(57) ABSTRACT

A high voltage (HV) semiconductor device is provided, comprising a substrate, a first well having a first conductive type and extending down from a surface of the substrate; a plurality of active devices respectively formed on the substrate, and the adjacent active devices electrically separated from each other by an insulation. One of the active devices comprises a diffusion region doped with impurity of the first conductive type and extending down from a surface of the first well, a ring gate formed in the diffusion region, and a light doping region having a second conductive type and extending down from a surface of the diffusion region. The light doping region is offset from an edge of the insulation.

20 Claims, 7 Drawing Sheets

# ACTIVE DEVICE AND HIGH VOLTAGE-SEMICONDUCTOR DEVICE WITH THE SAME

BACKGROUND

1. Field of the Invention

The disclosure relates in general to an active device and a semiconductor device with the same, and more particularly to an active device sufficient to sustain high voltage (HV) operation and a HV semiconductor device with the active device free of STI edge issue.

2. Description of the Related Art

In modern very-large-scale integration (VLSI) technology, the shallow-trench isolation (STI) is usually used to isolate the active devices (such as CMOS transistors) to define the channel width. However, it has been found that the STI edge, in many cases, has several serve issues.

FIG. 1 illustrates a conventional layout of a semiconductor device. The semiconductor device comprises several active devices 10 arranged separately from each other on a substrate and within a first well with the first conductive type, such as a P-well (PW) for the NMOS. Also, a light doping region having the second conductive type (such as N−) is correspondingly confined within the PW and encloses all of the active devices 10 and P-well contact. The adjacent active devices 10 are isolated by the STI. Each active devices 10 comprises a diffusion region DIF with the first conductive type, a first contact region 111 (such as a drain region) and a second contact region 113 (such as a source region) respectively formed in the diffusion region DIF, and a poly gate PG (having a gate contact 115 thereon) formed between the first contact region 111 and the second contact region 113. For the conventional semiconductor device, STI existing between the adjacent active devices 10 cause undesired STI edge issues.

FIG. 2 is a cross-sectional view showing the isolations besides the poly gate of a conventional semiconductor device. A poly gate PG is formed on the gate oxide GOX, and a channel 135 is formed under the poly gate PG and between the isolations STI. FIG. 3A shows the $I_D$-$V_G$ characteristic curves of a typical low voltage (LV) NMOS transistor with 70 Å of the gate oxide (GOX=70 Å) and W/Lg=0.6 µm/0.4 µm, and the curves are measured at a drain bias $V_D$=0.1 V. FIG. 3B shows the $I_D$-$V_G$ characteristic curves of a typical high voltage (HV) NMOS transistor with 370 Å of the gate oxide (GOX=370 Å) and W/Lg=10 µm/1.6 µm, and the curves are measured at a drain bias VD=0.1V. Please refer to FIG. 1~FIG. 3B. The STI edge is often a "weak point" (as circled in FIG. 2) that causes abnormal subthreshold leakage current and leads to an undesirable double hump in the subthreshold $I_D$-$V_G$ characteristics (such as curves Process-1 in FIG. 3A and FIG. 3B). In FIG. 3A and FIG. 3B, curves Process-1 represent the $I_D$-$V_G$ characteristic curves of the typical NMOS transistors with double hump leakage, curves Process-2 represent the $I_D$-$V_G$ characteristic curves of the typical NMOS transistors with improved STI, and curves Process-3 represent the $I_D$-$V_G$ characteristic curves of the typical NMOS transistors with improved STI and sidewall STI pocket implant.

Generally, the STI sidewall often has several non-ideal issues, such as: (1) boron segregation at the STI sidewall that leads to p-well dosage loss; (2) STI induced stress that affects Vt (threshold voltage) stability; and (3) some interface trap or dislocation that enhanced leakages. All these issues cause the non-ideal subthreshold behavior and higher leakage current issues. Although a sidewall STI pocket IMP is frequently applied at the "weak points" (as circled in FIG. 2) to raise the local well-doping at the STI sidewall and suppress the double-hump leakage (curves Process-3), it has drawbacks including: (1) reduced junction breakdown of HVNMOS, because junction (NM) will see more P-well doping at the STI edge; and (2) severe narrow-width effect when the channel width is scaled down. The STI pocket IMP still affects the channel doping and affects the Vt control.

SUMMARY

The disclosure relates to an active device and a high voltage (HV) semiconductor device with the same. An active device of the embodiment is designed for sufficiently sustaining HV operation and free of STI edge issue. The HV semiconductor device applied with the active devices of the embodiment has advantages of low leakage and higher breakdown voltage.

According to one embodiment of the present disclosure, a high voltage (HV) semiconductor device is provided, comprising a substrate, a first well having a first conductive type and extending down from a surface of the substrate; a plurality of active devices respectively formed on the substrate, and the adjacent active devices electrically separated from each other by an insulation (ex: STI). One of the active devices comprises a diffusion region (ex: an active area AA) doped with impurity of the first conductive type and extending down from a surface of the first well, a ring gate formed in the diffusion region, and a light doping region having a second conductive type and extending down from a surface of the diffusion region. The light doping region is offset from an edge of the insulation.

According to one embodiment of the present disclosure, a high voltage (HV) semiconductor device is provided, comprising a substrate, a first well having a first conductive type and extending down from a surface of the substrate; a plurality of active devices respectively formed on the substrate, and the adjacent active devices electrically separated from each other by an insulation (ex: STI). One of the active devices comprises a diffusion region (ex: an active area AA) doped with impurity of the first conductive type and extending down from a surface of the first well, a gate formed in the diffusion region, and a light doping region having a second conductive type and extending down from a surface of the diffusion region. The light doping region is correspondingly confined within the diffusion region.

According to one embodiment of the present disclosure, an active device is provided. The active device comprises a diffusion region doped with impurity of a first conductive type and formed in a substrate, a ring gate formed in the diffusion region, a light doping region having a second conductive type and extending down from a surface of the diffusion region, a first contact having the second conductive type and formed within the light doping region, and a second contact having the second conductive type, and the second contact formed in the diffusion region and within a first region surrounded by the ring gate. The first contact is offset from an edge of the light doping region, and the second contact is offset from the ring gate. Also, the light doping region is offset from an edge of the diffusion region.

The disclosure will become apparent from the following detailed description of the preferred but non-limiting embodiments. The following description is made with reference to the accompanying drawings.

DETAILED DESCRIPTION

In the embodiment of the present disclosure, an active device and a semiconductor device with the same are provided. The embodied active device is designed for sufficiently sustaining high voltage (HV) operation by forming a light doping region (such as N−) in an active area (i.e. the diffusion region) of the active device, wherein the light doping region is offset from an edge of the insulation (ex: STI) for electrically isolating adjacent active devices, thereby preventing the degradation of the active device caused by the insulation edge effect. The embodiment of the present disclosure can be implemented in many different types of the high voltage (HV) semiconductor devices, such as the HV semiconductor devices sufficiently sustaining about 30V voltage operation. The embodiment provided hereinafter with reference to the accompanying drawings is for elaborating an embodied active device and a novel layout of a HV semiconductor device. It is noted that the descriptions disclosed in the embodiments of the disclosure such as the detailed structures, scale of related elements and material selections are disclosed for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Figure 1:
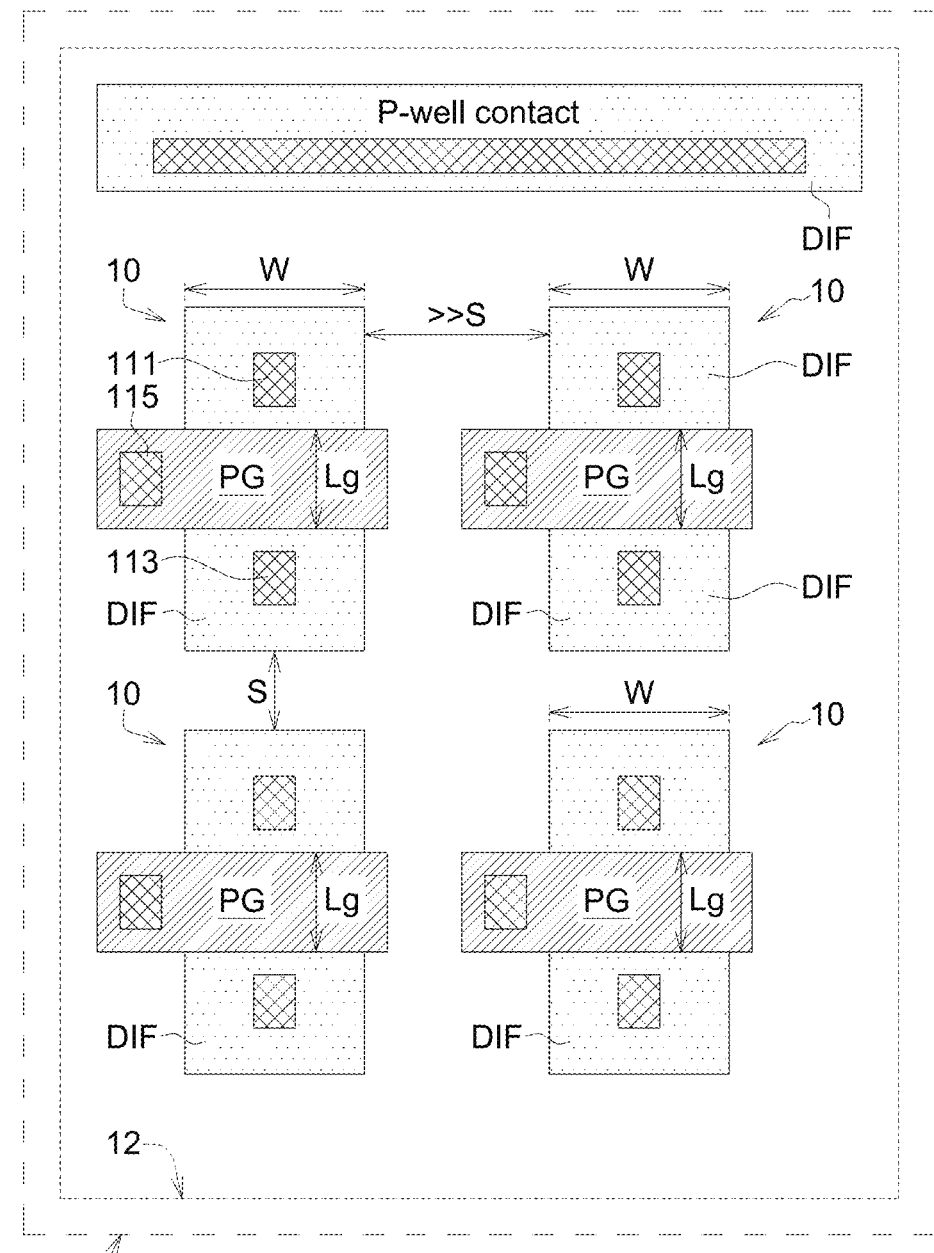
FIG. 1 (prior art) illustrates a conventional layout of a semiconductor device.
Figure 2:
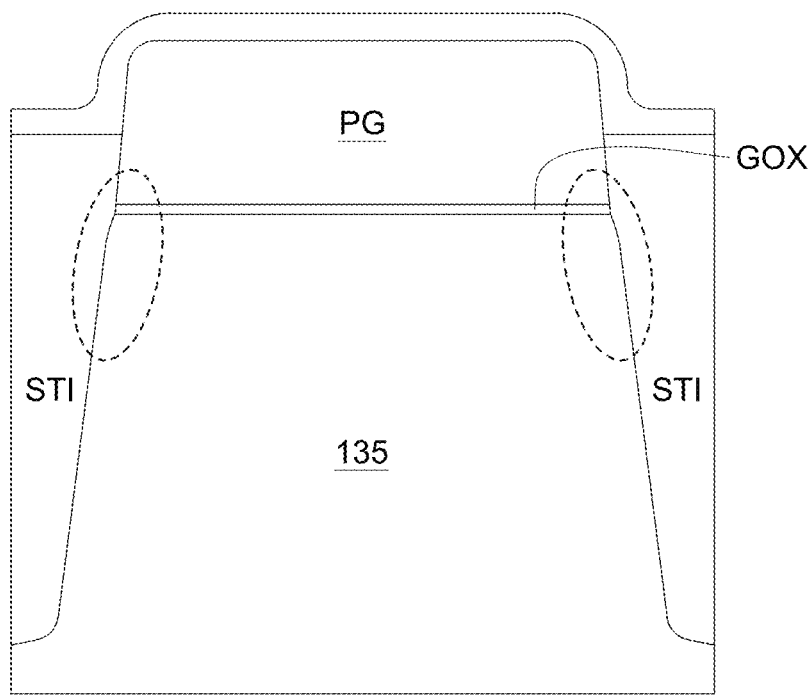
FIG. 2 (prior art) is a cross-sectional view showing the isolations besides the poly gate of a conventional semiconductor device.
Figure 3A:
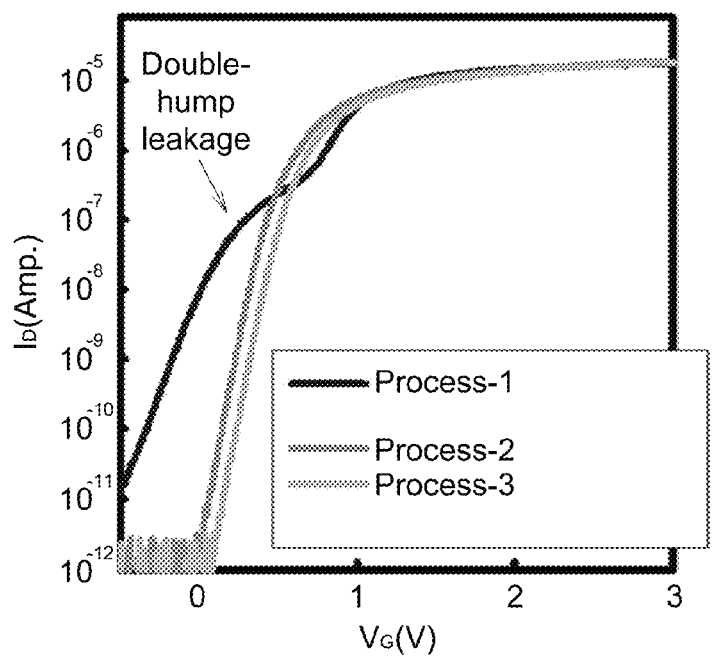
FIG. 3A (prior art) shows the $I_D$-$V_G$ characteristic curves of a typical low voltage (LV) NMOS transistor with 70 Å of the gate oxide and W/Lg=0.6 µm/0.4 µm, and the curves are measured at a drain bias $V_D$=0.1V.
Figure 3B:
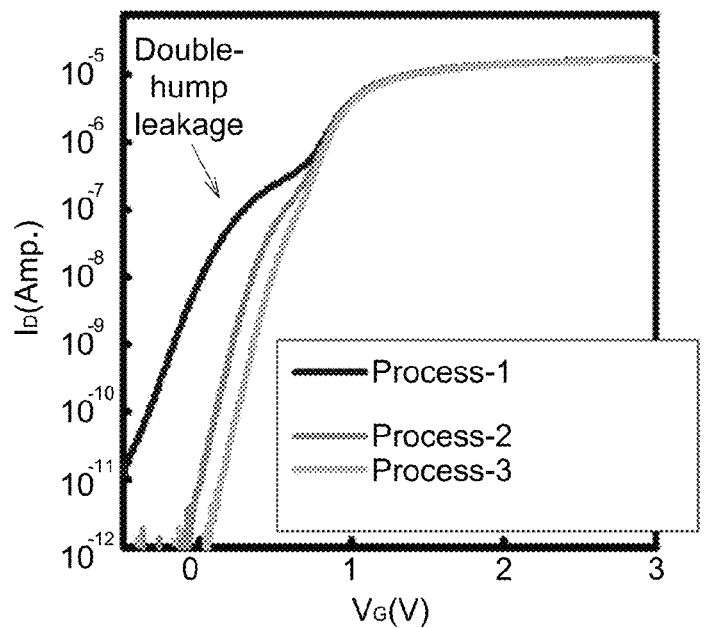
FIG. 3B (prior art) shows the $I_D$-$V_G$ characteristic curves of a typical high voltage (HV) NMOS transistor with 370 Å of the gate oxide and W/Lg=10 µm/1.6 µm, and the curves are measured at a drain bias VD=0.1 V.
Figure 4:
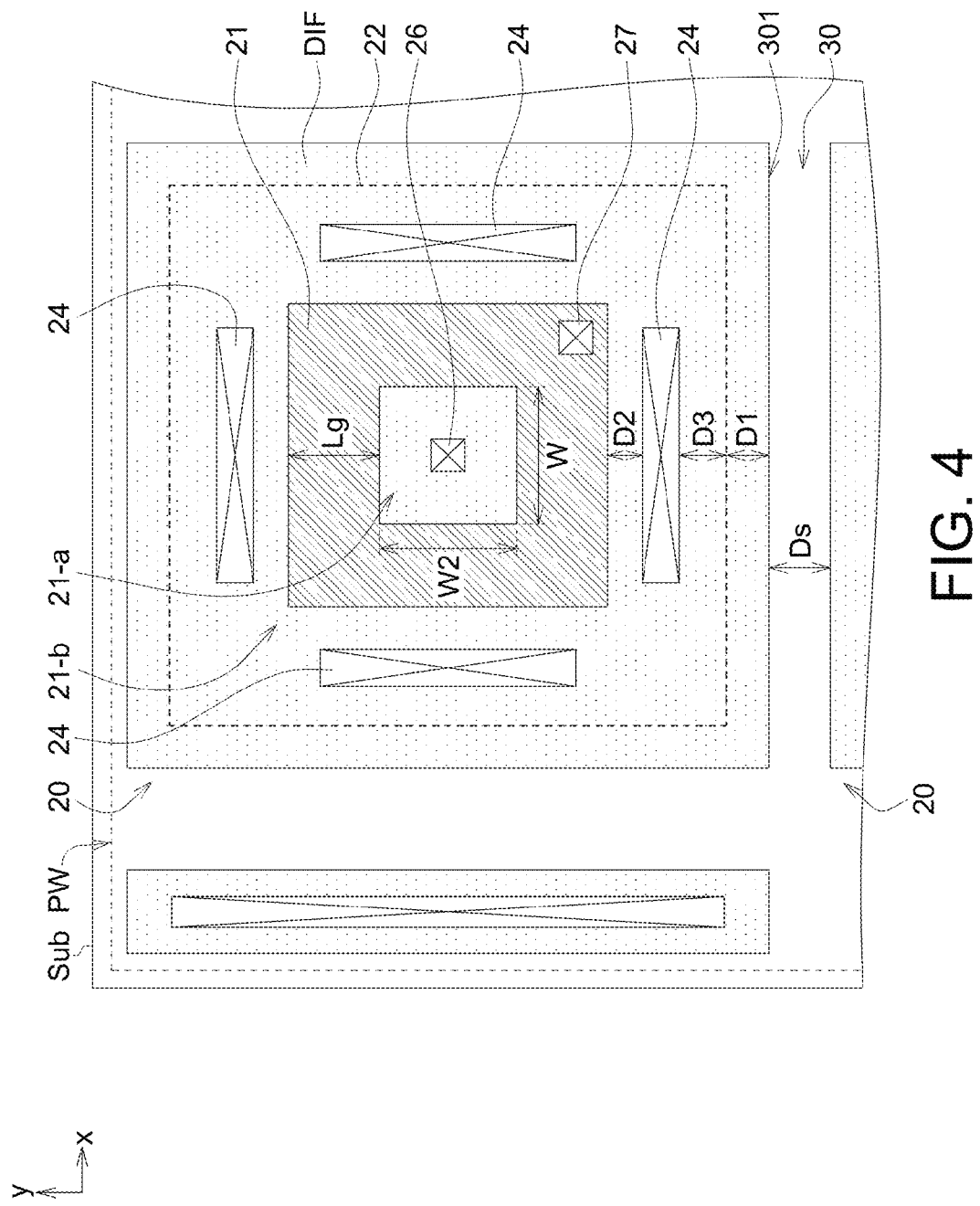
FIG. 4 illustrates part of a novel layout of a semiconductor device and an active device according to an embodiment of the disclosure.

FIG. 4 illustrates part of a novel layout of a semiconductor device and an active device according to an embodiment of the disclosure. In the embodiment, a semiconductor device (such as a HVNMOS) comprises a substrate Sub, a first well having the first conductive type (such as P-type) PW, and a plurality of active devices 20 respectively formed in the first well PW of the substrate Sub. In the embodiment, the adjacent active devices 20 are electrically separated from each other by an insulation 30 such as shallow trench isolation (STI). As shown in FIG. 4, one of the active devices 20 comprises a diffusion region DIF (also can be referred as an active area, AA, of the active device 20) doped with impurity of the first conductive type (ex: P-type) and extending down from a surface of the first well PW, a gate 21 formed in the diffusion region DIF, a light doping region (ex: NM) 22 having a second conductive type (ex: N-type) and extending down from a surface of the diffusion region DIF. According to the embodiment, the light doping region 22 is offset from an edge 301 of the insulation 30 (ex: at a distance of D1 in FIG. 4) for preventing the SIT edge issue. In one embodiment, a boundary of the diffusion region DIF is corresponding to the edge 301 of the insulation 30.

In one embodiment, the gate 21 is configured as a ring shape (ex: donut-shape) and noted as a ring gate. As shown in FIG. 4, the ring gate 21 formed in the diffusion region DIF is confined within the light doping region 22 and offset from the light doping region 22. According to one embodiment, the ring gate 21 can be made from polysilicon.

Also, the active device 20 further comprises a first contact 24 (such as a source contact) having the second conductive type (ex: N-type, N+), and the first contact 24 is formed within the light doping region 22 and the first contact 24 is offset from the ring gate 21 (ex: at a distance of D2 in FIG. 4).

In one embodiment, the first contact 24 is positioned between the ring gate 21 and the edge of the light doping region 22, and the first contact 24 is offset from the ring gate 21 and offset from the edge of the light doping region 22 (ex: at a distance of D3 in FIG. 4), as shown in FIG. 4.

In the embodiment, a first region 21-a surrounded by the ring gate 21 and a second region 21-b outside the ring gate 21 are defined correspondingly. Also, the second region 21-b is defined between the light doping region 22 and the ring gate 21.

In the embodiment, the active device 20 further comprises a second contact (such as a drain contact) 26 having the second conductive type (ex: N-type, N+), and the second contact 26 is formed in the diffusion region DIF and within the first region 21-a surrounded by the ring gate 21. According to the embodiment, the second contact 26 in the first region 21-a is offset from the ring gate 21.

In one embodiment, the active device comprises four of the first contacts 24 (such as four of the source contacts) having the second conductive types formed in the second region 21-b. As shown in FIG. 4, the four of the first contacts 24 can be arranged along the sides of the ring gate 21 and offset from the ring gate 21. For example, if the ring gate 21 is in a shape of square-donut with four sides as shown in FIG. 4, each of the first contacts 24 can be arranged correspondingly at one side of the ring gate 21 by offsetting from the ring gate 21.

Also, the active device 20 further comprises a gate contact 27, which is positioned correspondingly at the ring gate 21. However, the position of the gate contact 27 is not limited to that shown in FIG. 4, and other positions may be applicable as long as the gate contact 27 electrically connects the ring gate 21.

During the fabrication, the openings corresponding to the first region 21-a in the ring gate 21 and the second region 21-b are formed, and the light doping region 22 is then formed below the ring gate 21 by lightly doping impurities of the second conductive type (ex: N−), and the area of the light doping region 22 is shown in FIG. 4. Next, the first contacts 24 and the second contact 26 are defined (ex: the spacers such as oxide with adequate shape are formed in the first region 21-a to define the second contact 26). The first contacts 24, the second contact 26 and the gate contact 27 are determined at the corresponding positions, followed by the plug implantation to heavily dope impurities of the second conductive type (ex: N+) under the contacts. However, the present disclosure is not limited thereto. It is noted that the steps described here are for illustration only, and can be modified or altered for achieving the actual requirements of the applications.

According to the active device 20 of the embodiment as described above, the ring gate 21 is confined within the light doping region 22, and the light doping region 22 is correspondingly confined within the diffusion region DIF. The light doping region 22 of the active device 20 is offset from an edge 301 of the insulation 30 at a distance D1, thereby solving the issue of STI edge effect. Also, the first contact(s) 24 of the active device 20 formed within the light doping region 22 is(are) offset from the ring gate 21, thereby minimizing GIDL (gate induced drain leakage)-induced breakdown.

The first contacts 24 formed at the second region 21-*b* and the second contact 26 formed at the first region 21-*a* function as sources and drain, respectively. Additionally, the ring gate 21 of the active device 20 has a channel length (Lg) along a width of the ring gate, and the first contact 24 having the second conductive type is offset from the channel length (Lg) of the ring gate 21. In one embodiment, the channel length (Lg) of the ring gate 21 is about 1.6 μm. Sufficient channel length (Lg) sustains punch-through during high-voltage (HV) operation of the semiconductor device.

In the embodiment, the first region 21-*a* has a width W along the first direction (such as x-direction) and a length W2 along the second direction (such as y-direction). The width W can be equal to or different from the length W2, and the present disclosure has no limitation thereto. In one embodiment, the width W is equal to the length W2, and the effective channel width is about 4 W. In one embodiment, both of the width W and the length W2 are about 1.7 μm, and the effective channel width is about 6.8 μm (=4 W). The embodied active device 20 has sufficient channel width to accommodate center drain contact and drain offset requirement.

Figure 5:
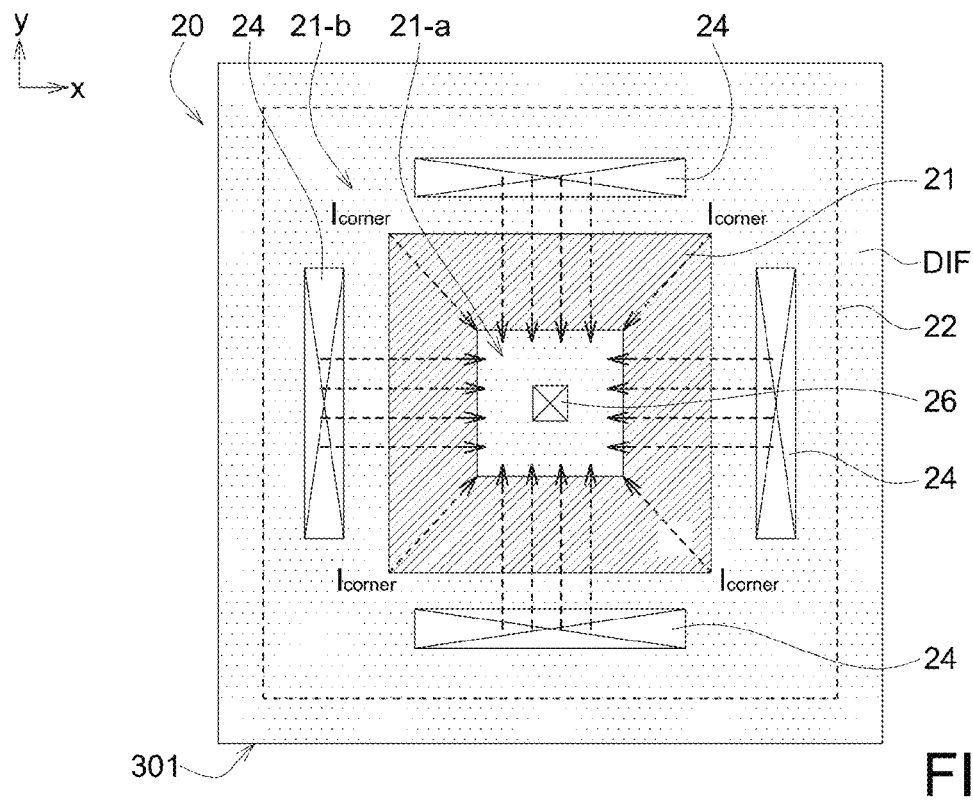
FIG. 5 depicts drain current between source and drain of the active device according to the embodiment of the disclosure.

FIG. 5 depicts drain current between source and drain of the active device according to the embodiment of the disclosure. The identical elements of FIG. 5 and FIG. 4 are designated with the same reference numerals for clearly presenting the embodiments, and the structural details of the active device 20 have been clearly described above and are not redundantly repeated. Please refer to FIG. 4 and FIG. 5.

As shown in FIG. 5, drain current flows from the first contacts 24 (such as the source contact) toward the second contact 26 (such as the drain contact). According to the embodied design, there is no STI edge in this active device 20 (ex: transistor), and the device is completely free from the STI edge issue without any double-hump leakage consequently. The corner current, $I_{corner}$, has even longer effective channel length equal to $\sqrt{2 \times (Lg^2)}$, and thus the corner current should not causes leakage. In the embodiment, the light doping region 22 (i.e. light-doped shallow junction) is spaced apart from the edge 301 of the insulation 30 (ex: STI edge), and the impact of NM to STI edge breakdown can be effectively minimized.

Figure 6:
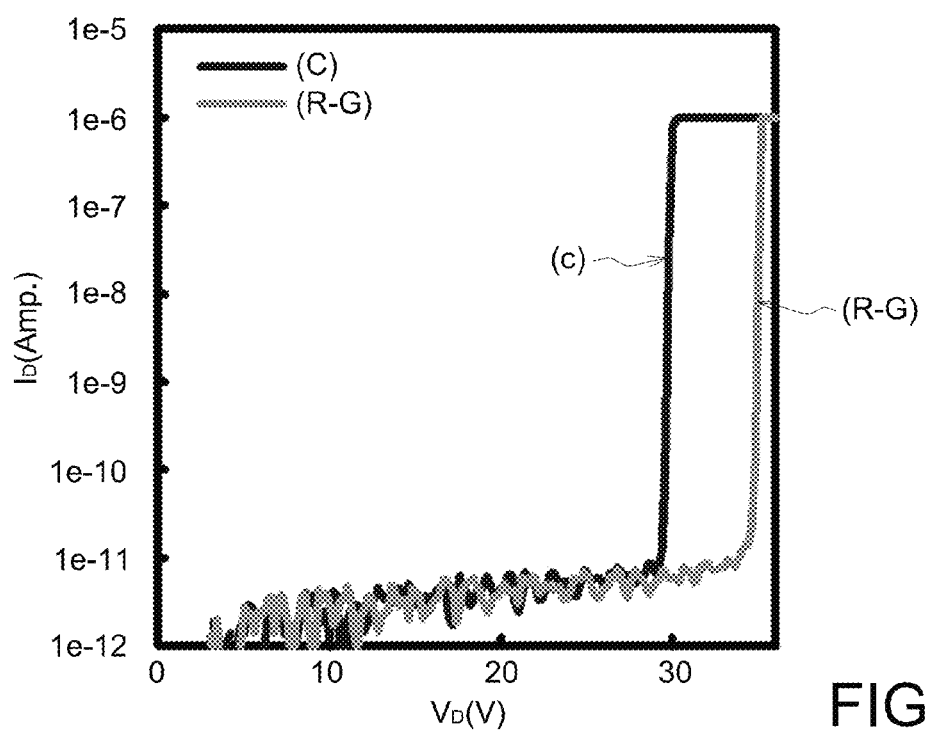
FIG. 6 shows $I_D$-$V_G$ characteristic curves of a ring gate transistor of the embodiment and a conventional MOSFET layout.

FIG. 6 shows $I_D$-$V_G$ characteristic curves of a ring gate transistor of the embodiment and a conventional MOSFET layout. Curve (C) represents the $I_D$-$V_G$ characteristics of the conventional MOSFET layout, and Curve (R-G) represents the $I_D$-$V_G$ characteristics of the ring gate transistor of the embodiment. Since the light doping region 22 is away from the STI edge and STI pocket IMP applied at the "weak points" at the STI sidewall, the breakdown voltage of the ring gate transistor of the embodiment can be significantly increased.

Figure 7:
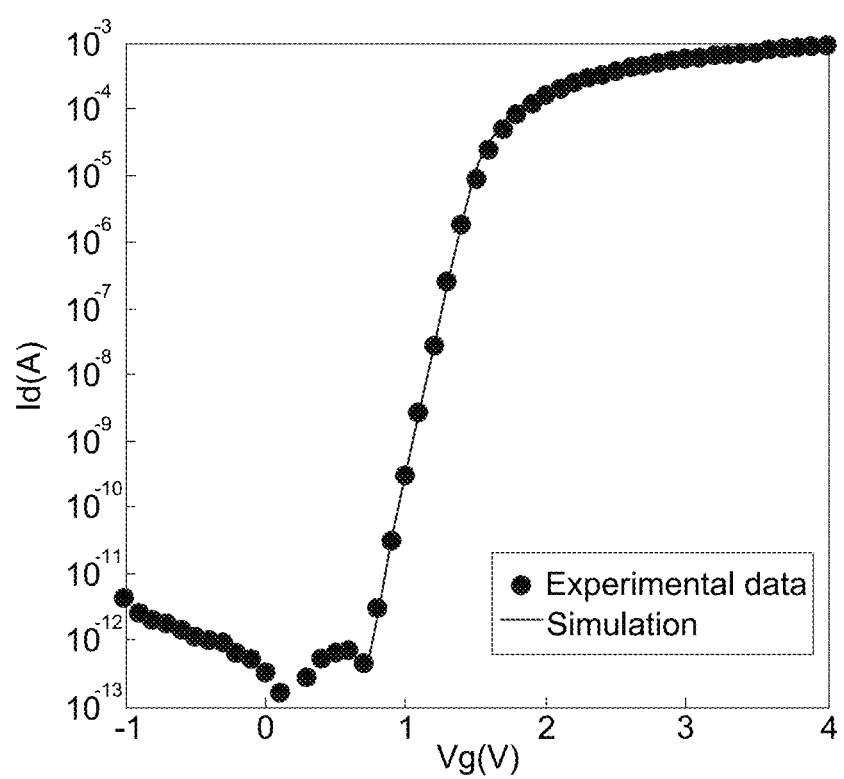
FIG. 7 shows $I_D$-$V_G$ characteristic curves of a novel layout transistor MOSFET according to the embodiment of the disclosure.

FIG. 7 shows $I_D$-$V_G$ characteristic curves of a novel layout transistor MOSFET according to the embodiment of the disclosure. In FIG. 6, it is clearly indicated that no double-hump leakage occurs and the experimental data excellent fit with the simulation curve of the theoretical model. Also, extremely low leakage is observed when Vg is less than 0.7V.

Figure 8:
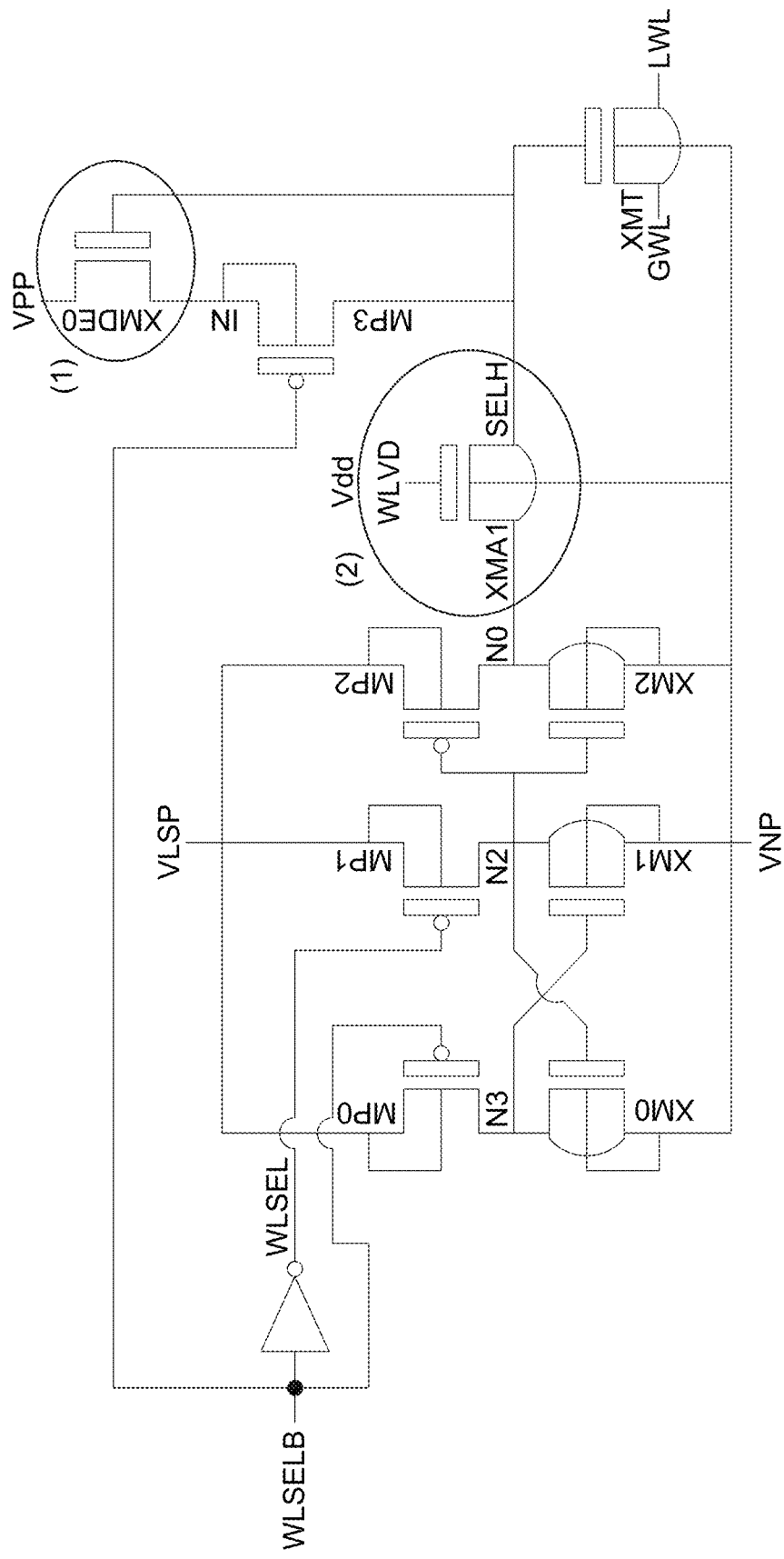
FIG. 8 shows a NAND Flash X-decoder (XDEC) design.

FIG. 8 shows a NAND Flash X-decoder (XDEC) design. Devices (1) and (2) of FIG. 8 suffer the strongest junction bias, and are critical for the NAND Flash XDEC design. For the device (1), this depletion-mode HVNMOS must sustain Vpp in junction. For the device (2), this NMOS must sustain Vdd in the junction. Since the embodied active device possesses the advantages of minimizing the GIDL induced breakdown and increasing the breakdown voltage, it is suggested that the embodied device is particularly suitable for applying for constructing the devices (1) and (2) of FIG. 8, to provide robust structures of the devices (1) and (2) without STI edge induced trouble and variation. The devices (1) and (2) with the embodied structures may take up some space in the NAND Flash X-decoder; however, only one of each of the devices (1) and (2) are required in the block of FIG. 8, and the increased layout area of these two devices are tolerable.

Related parameters of a HV NMOS device (sustaining about 31V of operation) of NAND Flash peripheral circuit without STI edge issue are provided below for exemplification. Please refer to FIG. 4, an active device 20 is wrapped in a ring-type layout.

In one embodiment for a HV semiconductor device, the light doping region 22 of the active device is offset from the edge 301 of the insulation 30 at a distance D1 ranged from about 0.1 μm to about 0.4 μm. In one embodiment, the light doping region 22 of the active device is offset from the edge 301 of the insulation 30 at a distance D1 of about 0.2 μm.

In one embodiment for a HV semiconductor device, the first contact 24 (ex: N+) is formed within the light doping region 22 and offset from the ring gate (ex: Poly) at a distance D2 ranged from about 0.4 μm to about 1.2 μm, thereby minimizing GIDL (gate induced drain leakage)-induced breakdown.

In one embodiment, the first contact 24 of the active device is offset from the ring gate 21 at a distance D2 of about 0.8 μm.

In one embodiment for a HV semiconductor device, the first contacts 24 is offset from the light doping region 22 at a distance D3 of about 0.2 μm. Also, in one embodiment, the minimal size of the contacts such as the second contact 26 (ex: drain) and/or the gate contact region 27 is about 0.1 μm×0.1 μm.

In one embodiment for a HV semiconductor device, the channel length (Lg) is in a range of about 1.2 μm to about 5 μm. In one embodiment for HVNMOS to sustain 31V, the channel length (Lg) is about 1.6 μm. For depletion-mode HVNMOS (buried-channel device), the channel length is enlarged to about 4 μm.

Also, in one embodiment for a HV semiconductor device, the width W (assumed W=W2) of the ring gate 21 is in a range of about 1.5 μm to about 3 μm. In one embodiment, the width W of the ring gate 21 is about 1.7 μm. Additionally, the minimum space Ds between adjacent active devices 20 is larger than 0.6 μm for field isolation; for example, the minimum distance (Ds) between the active areas (i.e. the diffusion regions DIF) for HVNMOS is about 0.8 μm. Moreover, the pitch of the active devices 20 can be about 0.8 μm, suitable to design in NAND Flash where block length is also around 8 μm.

Although the conductive types of the first well and the light doping region 22 are exemplified as P type and N− type, the present disclosure is not limited to the exemplification above. For the PMOS (although it is less concerned in breakdown), it can be designed by just simply inversing the doping types of the well and junction. For example, the P type well PW and the N− light doping region 22 of the NMOS are substituted by the N type well NW and the P-light doping region for the PMOS.

According to the aforementioned description, the HV semiconductor device applied with the active devices of the embodiment is capable of sustaining high voltage operation by forming a light doping region 22 in an active area (i.e. the diffusion region) of the active device, and the light doping region is offset from an edge of the insulation (ex: STI). In one embodiment, the gate 21 can be designed as a ring-shaped. The contact(s) outside the gate 21 (such as the first contact 24) formed within the light doping region 22 is(are) offset from the gate 21 (i.e. ring gate), thereby minimizing GIDL (gate induced drain leakage)-induced breakdown. The HV semiconductor device applied with the active devices of the embodiment solves the undesired issue of STI edge effect such as double-hump subthreshold leakage and degraded breakdown of the conventional semiconductor device. Also, the HV semiconductor device applied with the active devices of the embodiment has advantage of low leakage, which has been proven by simulation results (ex: FIG. 7).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage (HV) semiconductor device, comprising:
a substrate;
a first well having a first conductive type disposed in the substrate;
a plurality of active devices respectively formed on the substrate, and the adjacent active devices electrically separated from each other by an insulation, and one of the active devices comprising:
a diffusion region doped with impurity of the first conductive type disposed in the first well;
a ring gate formed in the diffusion region; and
a light doping region having a second conductive type disposed in the diffusion region, wherein an edge of the light doping region is offset from an edge of the insulation and separated from the insulation by the diffusion region.

2. The HV semiconductor device according to claim 1, wherein said one of the active devices further comprises a first contact having the second conductive type, and the first contact is formed within the light doping region and offset from the ring gate.

3. The HV semiconductor device according to claim 2, wherein the first contact is positioned between the ring gate and the edge of the light doping region, and the first contact is offset from the ring gate and offset from the edge of the light doping region.

4. The HV semiconductor device according to claim 2, wherein said one of the active devices further comprises a second contact having the second conductive type, and the second contact is formed in the diffusion region and within a first region surrounded by the ring gate, wherein the second contact is offset from the ring gate.

5. The HV semiconductor device according to claim 1, wherein a second region is defined between the light doping region and the ring gate, and said one of the active devices further comprises four of first contacts having the second conductive types formed in the second region, wherein the four of the first contacts are arranged along the sides of the ring gate and offset from the ring gate.

6. The HV semiconductor device according to claim 1, wherein the light doping region is correspondingly confined within the diffusion region, and the ring gate is confined within the light doping region.

7. The HV semiconductor device according to claim 1, wherein the ring gate of the active device has a channel length (Lg) along a width of the ring gate, and said one of the active devices further comprises a first contact having the second conductive type and offset from the channel length of the ring gate.

8. The HV semiconductor device according to claim 1, wherein the light doping region of the active device is offset from the edge of the insulation at a distance ranged from about 0.1 μm to about 0.4 μm.

9. The HV semiconductor device according to claim 1, wherein said one of the active devices further comprises a first contact having the second conductive type, and the first contact is formed within the light doping region and offset from the ring gate at a distance ranged from about 0.4 μm to about 1.2 μm.

10. The HV semiconductor device according to claim 1, wherein a minimum distance between the diffusion regions of the adjacent active devices is about 0.6 μm.

11. A high voltage (HV) semiconductor device, comprising:
a substrate;
a first well having a first conductive type disposed in the substrate;
a plurality of active devices respectively formed on the substrate, and the adjacent active devices electrically separated from each other by an insulation, and one of the active devices comprising:
a diffusion region doped with impurity of the first conductive type disposed in the first well;
a gate formed in the diffusion region;
a light doping region having a second conductive type disposed in the diffusion region, and correspondingly confined within the diffusion region, wherein an edge of the light doping region is offset from an edge of the insulation and separated from the insulation by the diffusion region.

12. The HV semiconductor device according to claim 11, wherein an edge of the light doping region is offset from the edge of the insulation.

13. The HV semiconductor device according to claim 11, wherein said one of the active devices further comprises a first contact having the second conductive type, and the first contact is formed within the light doping region and offset from the gate.

14. The HV semiconductor device according to claim 13, wherein the first contact is positioned between the gate and the edge of the light doping region, and the first contact is offset from the gate and also offset from the edge of the light doping region.

15. The HV semiconductor device according to claim 13, wherein the gate is a ring gate, and said one of the active devices further comprises a second contact having the second conductive type, and the second contact is formed in the diffusion region and within a first region surrounded by the ring gate, wherein the second contact is offset from the ring gate.

16. The HV semiconductor device according to claim 11, wherein the gate is a ring gate, and a second region is defined between the light doping region and the ring gate, and said one of the active devices further comprises four of first contacts having the second conductive types formed in the second region, wherein the four of the first contacts are arranged along the sides of the ring gate and offset from the ring gate.

17. The HV semiconductor device according to claim 11, wherein the gate of the active device is a ring gate confined within the light doping region, and a first contact having the second conductive type formed in the diffusion region is offset from the ring gate and also offset from the light doping region.

18. The HV semiconductor device according to claim 11, wherein the light doping region of the active device is offset from the edge of the insulation at a distance ranged from about 0.1 μm to about 0.4 μm, and
said one of the active devices further comprises a first contact having the second conductive type, and the first contact is formed within the light doping region and offset from the gate at a distance ranged from about 0.4 μm to about 1.2 μm.

19. An active device, comprising:
an insulation used to electrically separate the active device from an adjacent active device;
a diffusion region doped with impurity of a first conductive type and formed in a substrate;
a ring gate formed in the diffusion region;
a light doping region having a second conductive type, and the light doping region disposed in the diffusion region;
a first contact having the second conductive type, and the first contact formed within the light doping region and offset from an edge of the light doping region; and
a second contact having the second conductive type, and the second contact formed in the diffusion region and within a first region surrounded by the ring gate, wherein the second contact is offset from the ring gate;
wherein the edge of the light doping region is offset from an edge of the diffusion region and separated from the insulation by the diffusion region.

20. The active device according to claim 19, wherein the light doping region is correspondingly confined within the diffusion region, and the first contact is offset from the ring gate.

* * * * *